Figure 1:
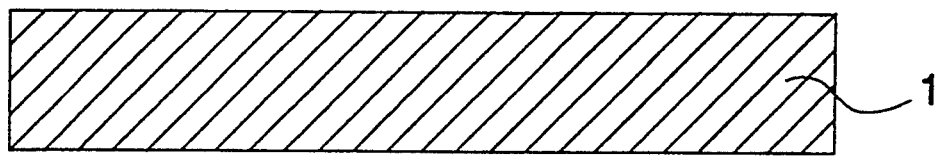

United States Patent [19]

Schmidt et al.

[11] Patent Number: 5,442,143
[45] Date of Patent: Aug. 15, 1995

[54] CORE FOR ELECTRICAL CONNECTING SUBSTRATES AND ELECTRICAL CONNECTING SUBSTRATES WITH CORE, AS WELL AS PROCESS FOR THE PRODUCTION THEREOF

[75] Inventors: Walter Schmidt, Zürich; Marco Martinelli, Neftenbach, both of Germany

[73] Assignee: Dyconex Patente AG, Zug, Switzerland

[21] Appl. No.: 216,717

[22] Filed: Mar. 23, 1994

[30] Foreign Application Priority Data

Apr. 16, 1993 [CH] Switzerland ............ 01163/93

[51] Int. Cl.⁶ .................................................. H05K 1/00
[52] U.S. Cl. ............................. 174/262; 174/257; 174/258; 174/264; 174/266; 361/785; 361/790
[58] Field of Search ............ 174/262, 256, 257, 258, 174/263, 264, 265, 266; 361/784, 785, 789, 790

[56] References Cited

U.S. PATENT DOCUMENTS

| | | |
|---|---|---|
| 4,511,757 | 4/1985 | Ors et al. |
| 5,286,926 | 2/1994 | Kimura et al. |
| 5,306,872 | 4/1994 | Kordus et al. |
| 5,311,059 | 5/1994 | Banerji et al. |
| 5,383,363 | 5/1983 | Hayakawa et al. |

Primary Examiner—Leo P. Picard
Assistant Examiner—Cheryl R. Figlin
Attorney, Agent, or Firm—Walter C. Farley

[57] ABSTRACT

The inventive core for electrical connecting substrates, particularly for printed circuit boards and foil circuit boards, has an inner layer (I) with a columnar structure and on either side, metallic cover layers (A,A'), the columnar structure of the inner layer (I) comprising columns (9.1,9.2), which are regularly arranged, spaced from one another and from the cover layers (A,A'), being directed transversely to the service extension of the core and made from an electrically conductive material in a matrix (6) of an electrically insulating material. The cover layers (A,A') e.g. have electrical terminals (16,16', 17,17') in the form of through-plated blind holes (13,14) on selected columns (9) of the inner layer (I) and are structured in such a way that they have a regular pattern of terminals (16,16') on the facing cover layer and terminals (17,17') on the through-connections insulated from the cover layers, this grid pattern can have a size of approximately 0.5 mm.

7 Claims, 9 Drawing Sheets

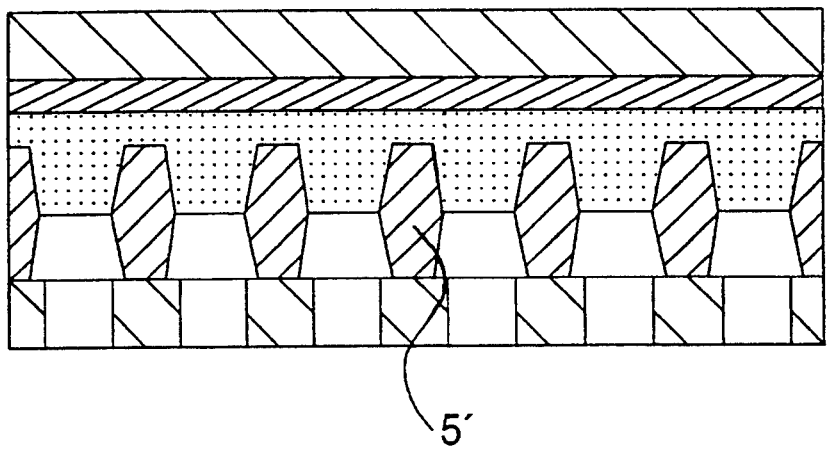
Fig. 10
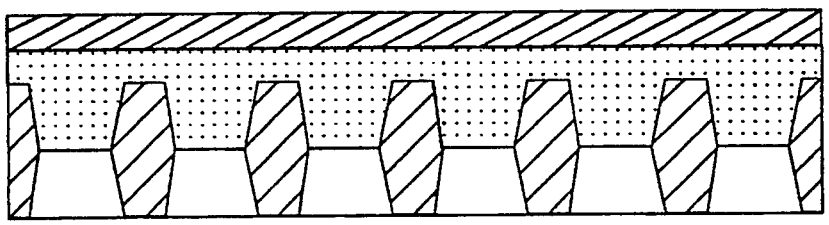
Fig. 11
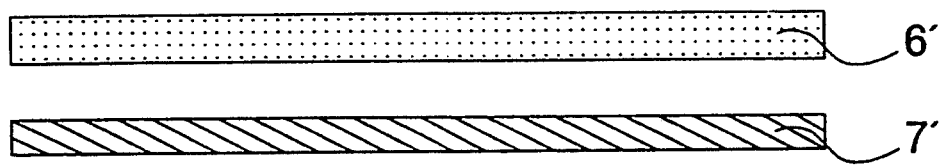

CORE FOR ELECTRICAL CONNECTING SUBSTRATES AND ELECTRICAL CONNECTING SUBSTRATES WITH CORE, AS WELL AS PROCESS FOR THE PRODUCTION THEREOF

The invention is in the field of the manufacture of electrical connecting substrates, particularly printed circuit boards and foil printed circuit boards with conductor layers on both sides, and relates to a core for electrical connecting substrates and electrical connecting substrates having a corresponding core according to the preambles of the corresponding, independent claims, as well as to processes for the manufacture thereof in accordance with the preambles of the corresponding, independent process claims.

Conventional printed circuit boards can have a large number of conductor planes, which are electrically interconnected by drilled holes, which pass through the entire circuit board. This type of Z-connection between the conductor planes of the board is appropriate if the latter is also to be assembled with elements, whose connecting legs have to be soldered into such through-holes. In this case the size of the through-holes is determined by the soldering legs and is generally 0.7 to 1 mm.

In the case of assembly with surface-mounted devices (SMD technology) no such holes are required for this purpose, so that the holes for the Z-connections can undergo diameter reductions down to 0.2 mm, which is roughly the lower limit of holes which can be produced by mechanical drilling. However, even such holes and the terminal pads connected thereto and which for tolerance reasons have a diameter of 0.5 to 1 mm, require a relatively large amount of space in the conductor planes. In addition, they must be produced sequentially, i.e. in a time-consuming manner. Drilling of such small holes is also complicated, because the drill thrust must be kept correspondingly small, because it is not possible to drill stacks of boards at the same time and because the thin drills are rapidly subject to wear. In addition, there are the general disadvantages linked with drilling, i.e. an additional working step for removing drilling burrs and also for removing drilling dust.

To obviate the disadvantages of drilled holes and so as to be able to drop below their lower diameter limit, e.g. in patent applications EP-92904744.7 (publication number 527980-P0619) and CH-1872/92-6 (P0655) of the same applicant, processes for the production of film circuit boards are described, in which the Z-connections between the individual conductor planes no longer pass through drilled holes and instead pass through holes produced in a dry etching stage (plasma etching). Set processes make it possible to significantly reduce the diameter of the hole, (i.e. it is possible to reduce it to 20 $\mu$m or even smaller) and blind holes can be produced with the same accuracy, openings having random shapes can be produced in addition to round holes, thousands of holes can be simultaneously produced, etc.

The base material generally used in the described processes are very thin plastic films, inter alia because with the dry etching processes used through etching is only possible of material with a thickness of approximately 100 $\mu$m in a plasma in an acceptably short time. This thinness of the material has advantages in that several conductor planes can be stacked on one another, without leading to circuit boards with an extreme thickness, but suffers from the disadvantage that such a circuit board, unless it has numerous conductor planes, is not mechanically rigid, i.e. it must be drawn onto a core.

Such cores are e.g. described in patent applications EP-91104096.2 (publication number 451541-P0391) and CH-938/92-5 (P0620) of the same applicant. Once again the described cores have holes which, as described hereinbefore in connection with circuit boards, must be produced by complicated drilling processes and which also take up space in the film or foil layers.

In order to be able to fully utilize for electrical connecting substrates with a core the advantages resulting from film or foil technology, apart from fulfilling the conditions of inherent rigidity and processibility with the foil material, the core ideally must be able to comply with the following requirements. So that the electrical connecting substrate can have on both sides signal lines and an assembly, the core must permit signal connections in the Z-direction, which restrict as little as possible the design of the conductors in the signal planes and which in particular take up the minimum amount of space in these planes. So that also in the case of high energy consumption, the assembly of the electrical connecting substrate can be as constricted as possible, the core must dissipate the heat loss of the devices as adequately as possible. So that the electrical connecting substrate can be manufactured as inexpensively as possible, the core must be an inexpensively manufacturable universal product which, in addition to the mechanical functions, should also be able to fulfill other universal functions (e.g. service functions) and which can be manufactured and tested independently of the function of the finished, electrical connecting substrate.

The problem of the invention is to provide a core for electrical connecting substrates, particularly printed circuit boards and foil circuit boards with conductor layers on both sides, enabling the above requirements to be fulfilled much better on an ideal core than with the known cores for electrical connecting substrates, i.e. with drilled holes. A further problem of the invention is to indicate processes enabling the manufacture of the core according to the invention and, on the basis of the latter, electrical connecting substrates, particularly circuit boards and foil circuit boards with conductor planes on both sides with the minimum expenditure.

This problem is solved by the core for electrical connecting substrates and the manufacturing processes defined in the claims.

The core for electrical connecting substrates in accordance with the invention has an inner layer with a columnar structure and on both sides metallic cover layers, the columnar structure comprising an arrangement of columns spaced from one another and from the cover layers and directed transversely to the surface extension of the core made from an electrically conductive material, e.g. copper in a matrix of an electrically insulating material, e.g. plastic such as polyimide, epoxy resin, etc. This columnar structure is advantageously regular. The spacing filled with insulating material between the metallic cover layer and the columns is such that it can be etched in a dry etching stage (plasma etching) in an appropriate time of approximately 100 $\mu$m.

In the case of such a core the cover layers can be electrically connected to selected columns for electrical lead-throughs in the Z-direction and corresponding points by means of through-plated blind holes. The columns can be very closely juxtaposed, so that they not only constitute a close grid for potential lead-throughs, but also a core made from a material with a high metal percentage, which has a good heat-dissipating action. Instead of being arranged in a regular grid, the columns can be distributed over the core in use-specific manner.

The metallic cover layers of the core can be structured to universal conductor planes, which through a surface structuring are suitable as service planes and which are constructed in such a way and connected to the columnar structure so as to have a regular grid for potential signal connections in the Z-direction and connections to the opposite, corresponding service plane. If further foils or films are laminated onto both sides of such a core, the conductors thereon can be connected through blind holes to the grid points of the core for corresponding, functional Z-connections. On wiring in each case one of the two service planes to earth and a supply voltage, then through the columnar structure of the inner layer and the grid structuring of the two service planes on either side, and in addition to the terminals for the signal connections, there are also earth and supply terminals, which can be correspondingly contacted from conductor planes above them.

Obviously, for simpler uses, the two metallic cover layers of the core can be individually (not universally in grid-like manner) structured and/or not exclusively as service planes and can be connected to the columnar structure.

The core according to the invention can e.g. be further processed with ceramic circuit carriers. The main function of the core is not to stiffen the resulting circuit board, but to electrically connect the circuit levels or planes on both sides.

For the manufacture of foil circuit boards at least one foil layer is laminated onto both sides of a core according to the invention and comprises an electrically insulating intermediate layer and a metal layer, the latter being structured as a conductor plane and electrically connected by through-plated blind holes through the insulating layer to the contact points of the core surface grid.

The core according to the invention and the processes for the production thereof are described in greater detail hereinafter relative to the drawings, wherein show:

FIGS. 1 to 16 different stages in the manufacture of an exemplified embodiment of the inventive core for electrical connecting substrates (cross-sections).

Figure 17:
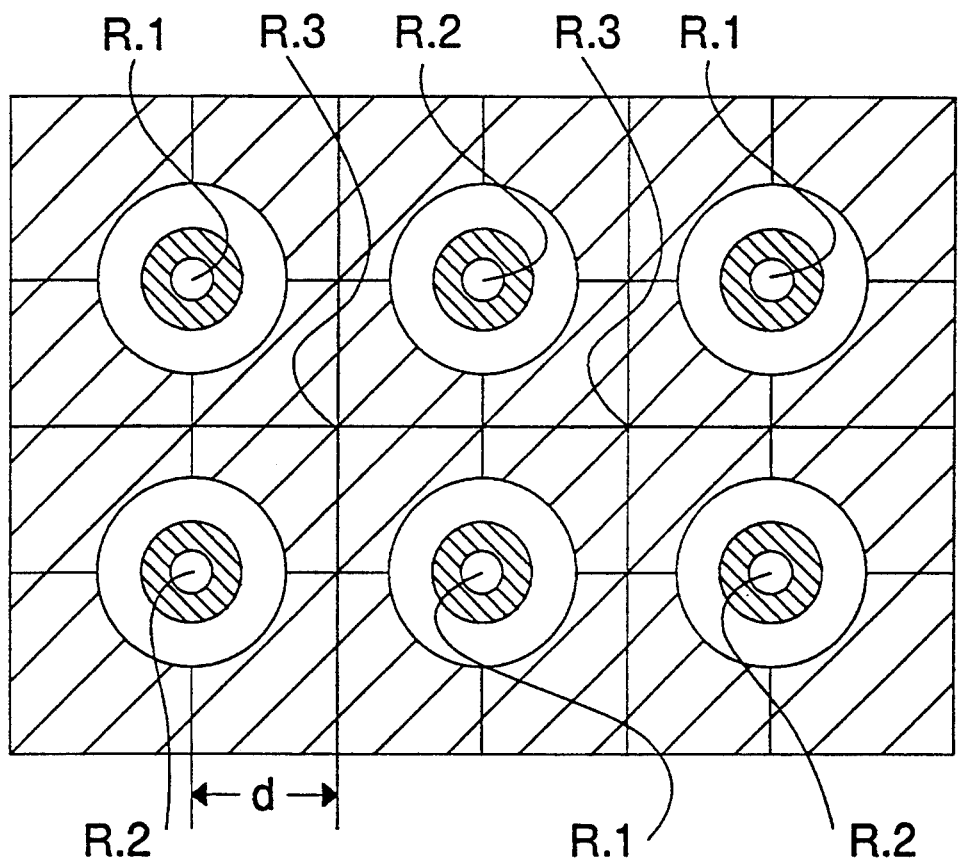

FIG. 17 a plan view of an exemplified embodiment of the inventive core for electrical connecting substrates.

Figure 18:
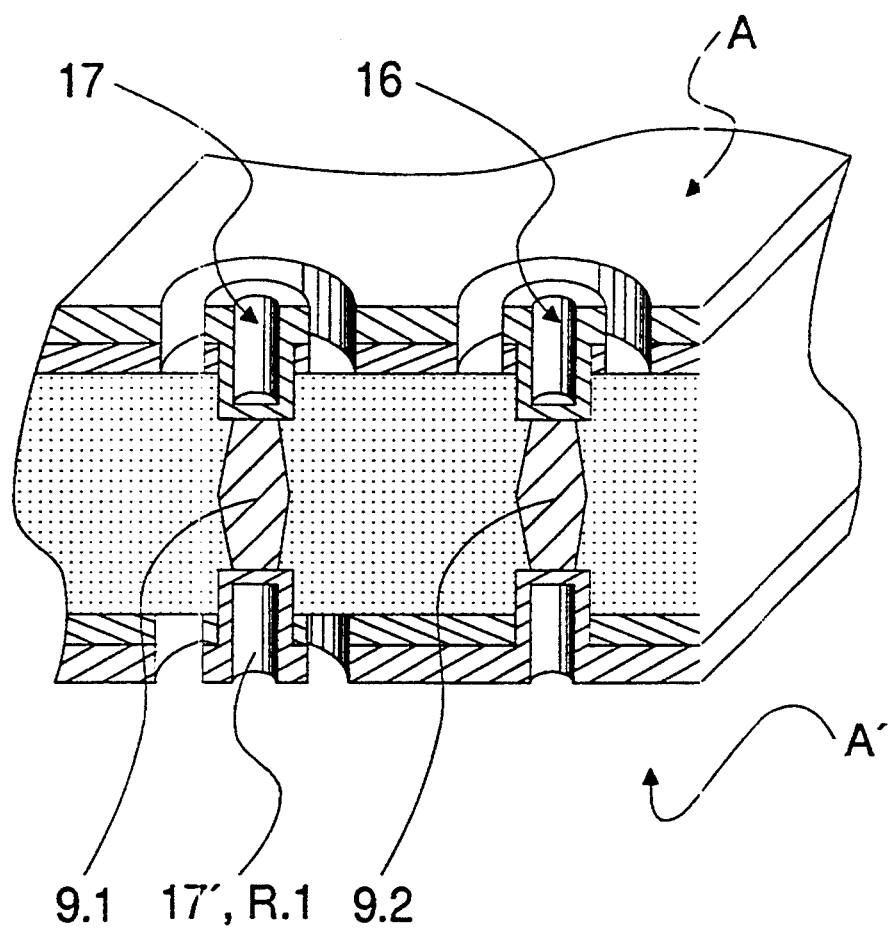

FIG. 18 a three-dimensional view of a sectioned core according to FIG. 17.

Figure 19:
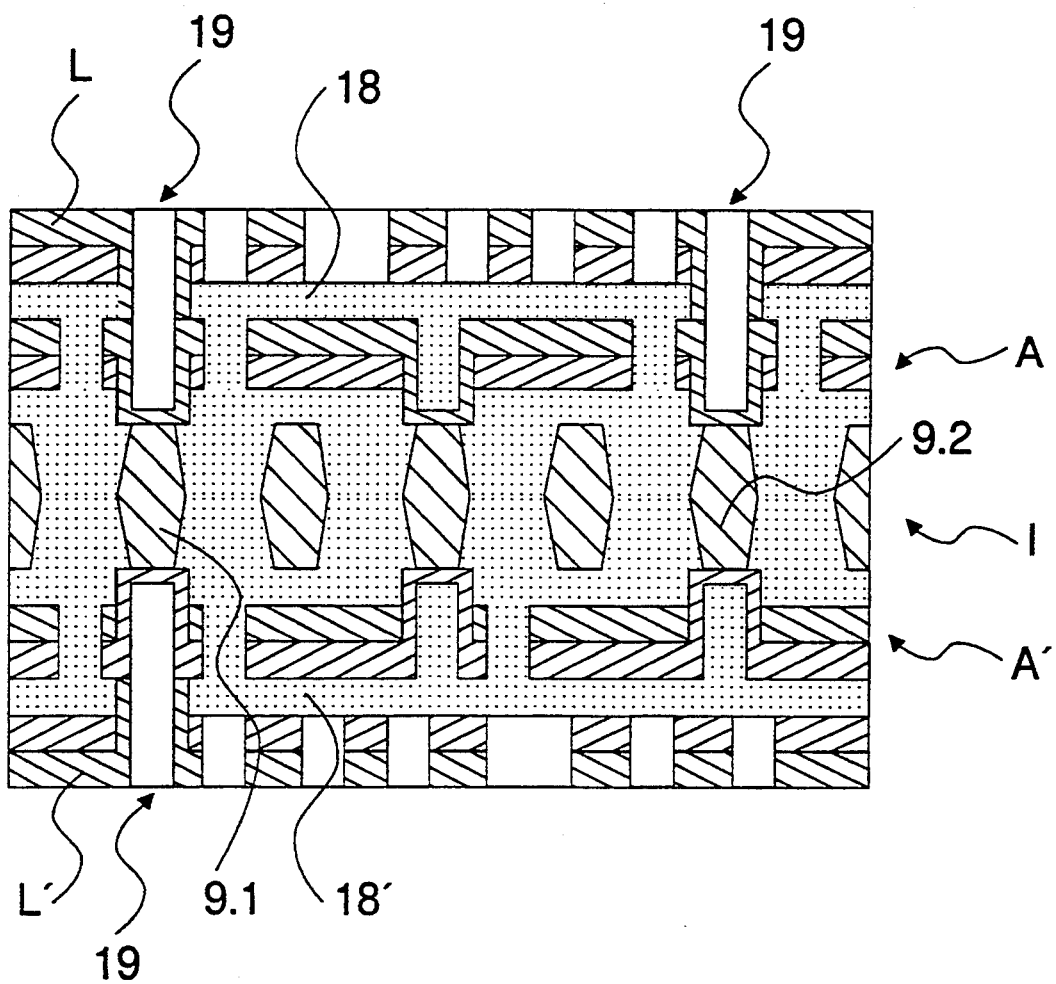

FIG. 19 a cross-section through an area of a foil circuit board with a core according to the invention.

FIGS. 1 to 16 illustrate different stages in the manufacture of an exemplified embodiment of the inventive core for electrical connecting substrates in each case in the form of a cross-section through an area of the corresponding core. The starting product is e.g. a copper foil. In place of copper foils it is also possible to use cold laminated composite foils consisting of a thicker aluminium foil and thinner copper foils laminated onto either side thereof. It is also possible to use as starting products e.g. foils made from stainless steel, brass, bronze, aluminium-magnesium alloys, invar, molybdenum, etc.

Figure 2:
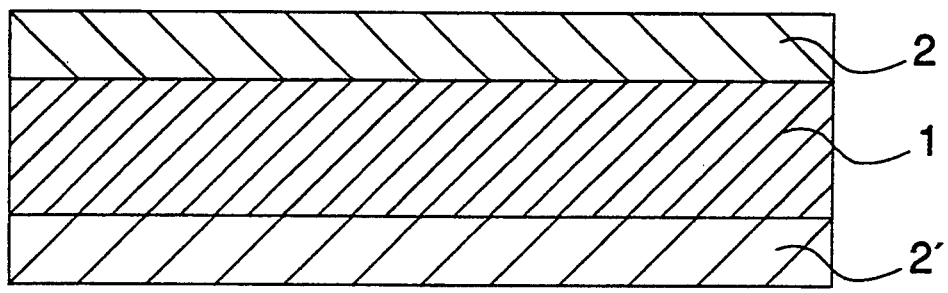
Figure 3:
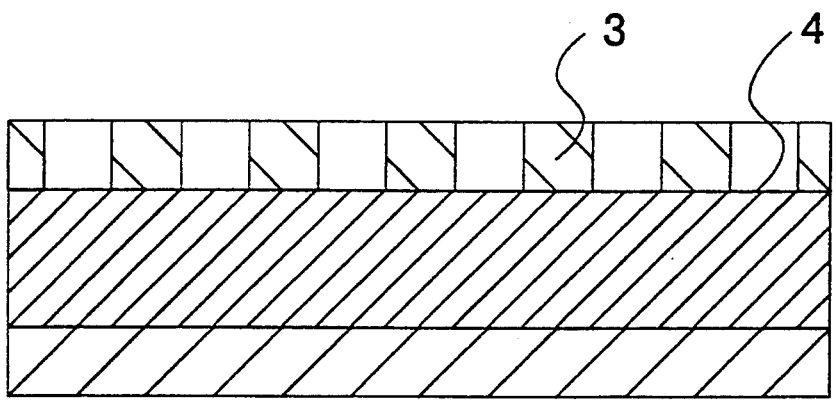
Figure 4:
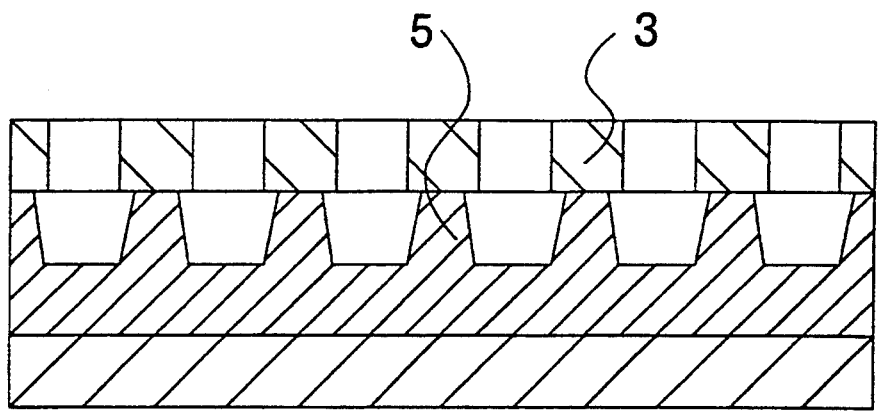
Figure 5:
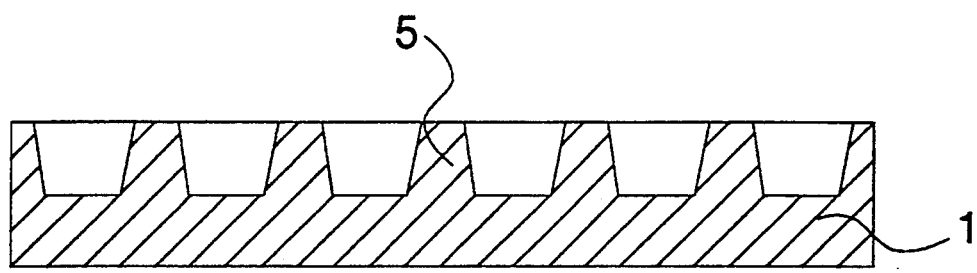

FIG. 1 shows the starting product e.g. comprising a 0.1 to 1 mm thick copper foil 1. Onto either side of this copper foil 1 is applied a photoresist 2,2', as shown in FIG. 2. The photoresist layer of one side is now exposed through a mask and developed in such a way that there is a regular pattern of resist islands 3 and intermediate areas 4 of exposed copper surface, as shown in FIG. 3. The resist islands are e.g. circular, but can also have other shapes. The foil is now etched by conventional processes, the etching parameters being chosen in such a way that the copper foil is approximately half-etched, as shown in FIG. 4. It is scarcely possible to avoid an undercutting of the photoresist islands 3 and this must be taken into consideration when dimensioning these. The photoresist is now stripped from both sides of the core and as a result on the worked side a copper surface is obtained having regularly arranged protuberances 5, as shown in FIG. 5.

Figure 6:
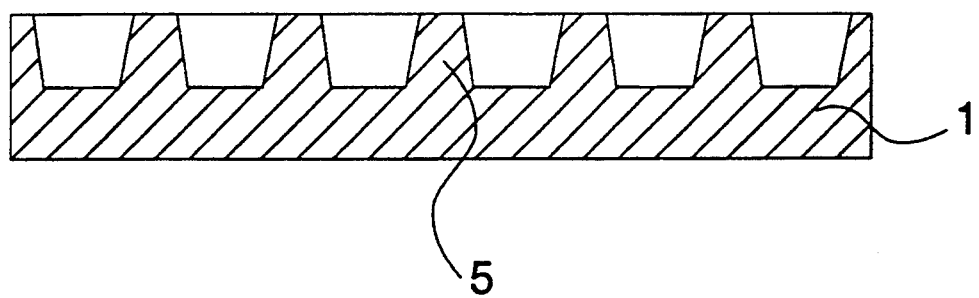
Figure 7:
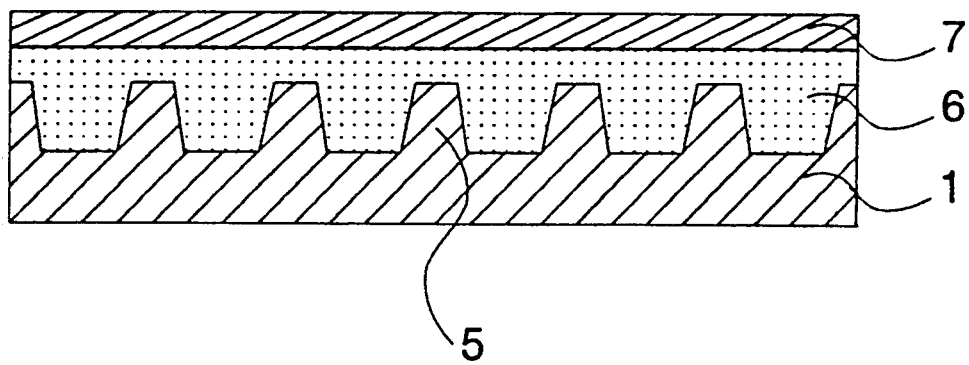
Figure 8:
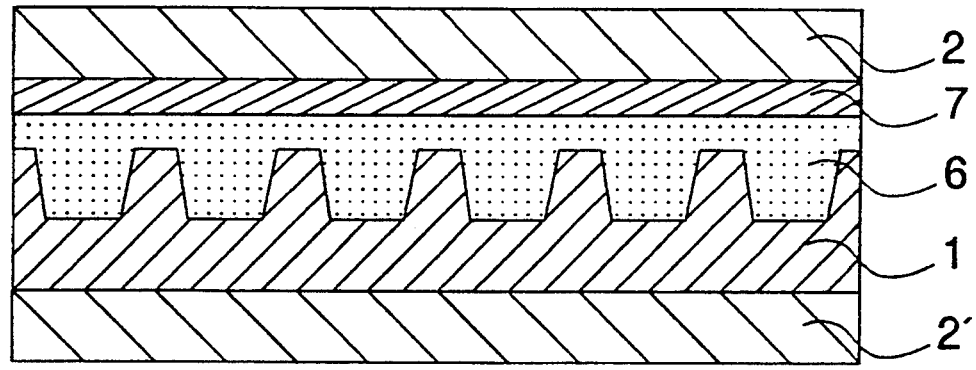
Figure 9:
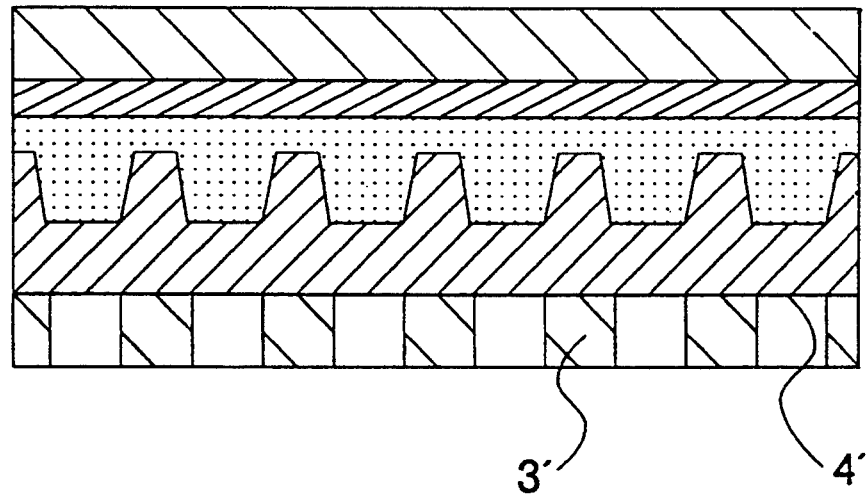

FIG. 6 shows how the one-sided worked semifinished product is pressed with an adhesive film 6, e.g. of epoxy resin, such as is also used for bonding rigid-flexible circuit boards and a thin copper foil 7 in vacuo at elevated temperature and under mechanical pressure. As a result of this pressing action the adhesive fills in bubble-free manner the cavities between the protuberances 5 and is cured. The thickness of the adhesive film 6 must be matched to the protuberance pattern of the copper foil 1 in such a way that the cavities are entirely filled with adhesive and that between the protuberances 5 and the pressed-on copper foil 7 there remains an adhesive coating separating the protuberances 5 and the copper foil 7 from one another. FIG. 7 shows the pressed product.

Figure 12:
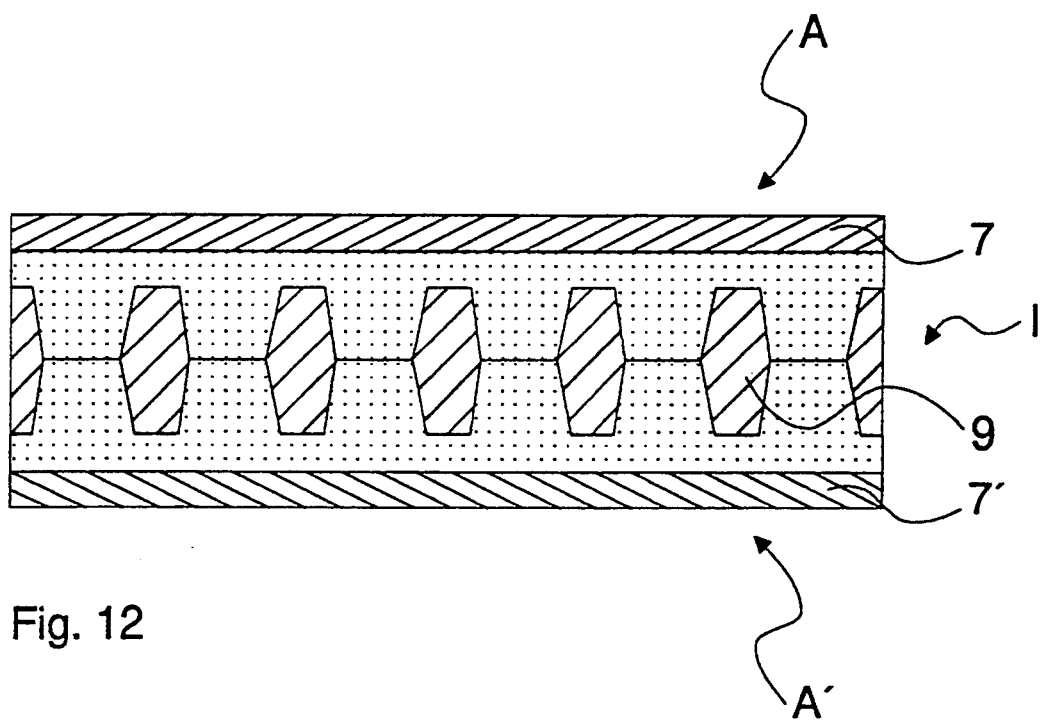

This is followed by the identical processing of the other side of the copper foil 1, as shown in FIGS. 8 to 12, the same units being given the same reference numerals followed by an apostrophe. FIG. 12 shows the core completed on both sides and in which now the protuberances 5,5' on both sides form copper columns 9, which are electrically insulated from one another and from the pressed-on copper foils 7,7' by the cured adhesive 6. This is the simplest embodiment of the core according to the invention, comprising an inner layer I with columns 9 in a matrix 6 and metallic cover layers A,A' on both sides.

Figure 13:
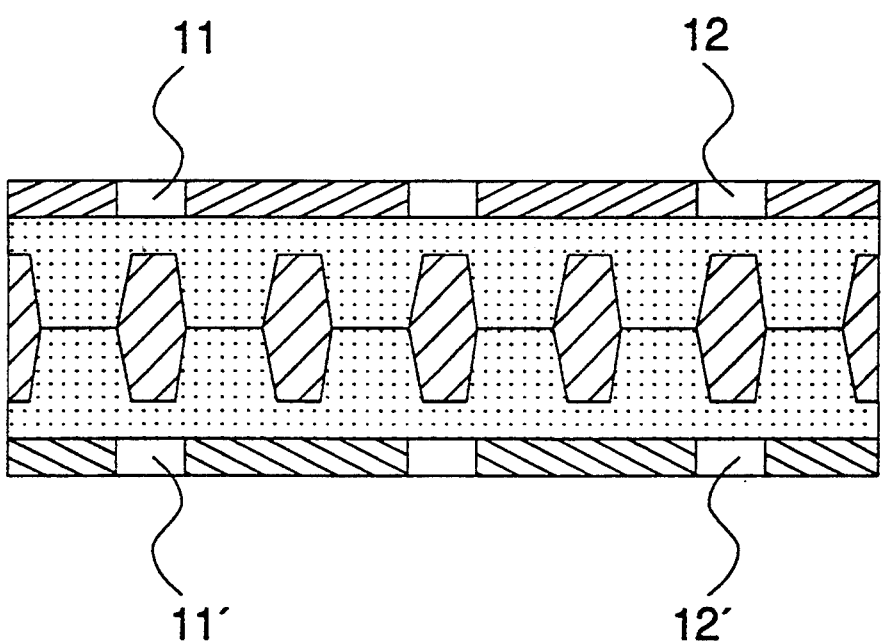
Figure 14:
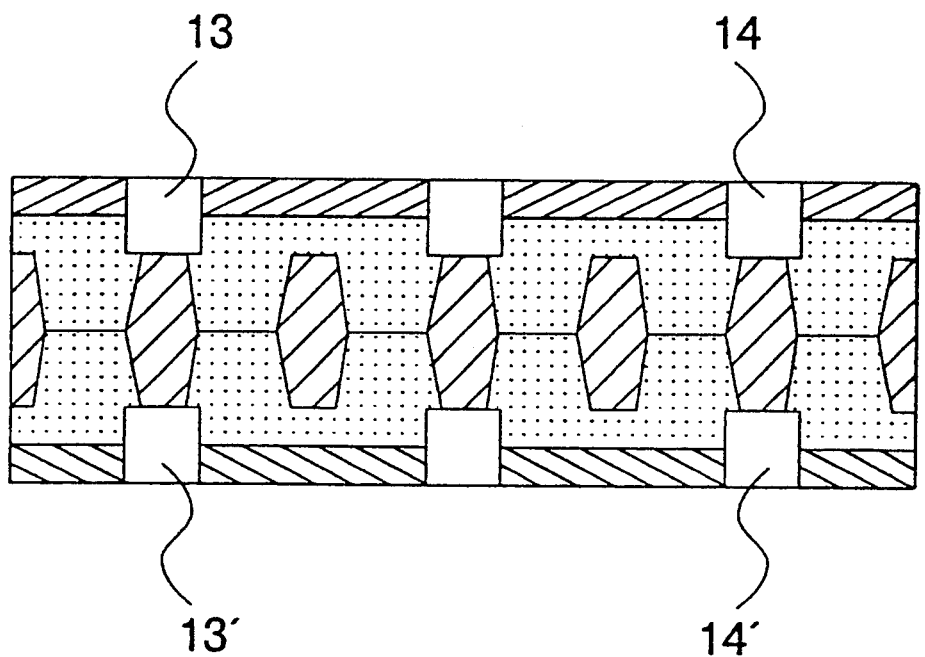

The shape of the columns (9) is dependent on the starting material, the shape and reciprocal arrangement of the resist islands and the etching parameters. When processing composite Cu-Al-Cu foils, on which the central aluminium layer has been attacked more during etching than the outer copper layers, corresponding, step-like columns are obtained. The outer copper layers 7,7' can now be further photochemically structured, in that on either side above those copper columns which are to serve as Z-connections, pairs of windows 11/11', 12/12' are etched in the copper layers 7,7', as shown in FIG. 13. For individual use this can also be based on a given pattern or universal, regular patterns. The core then undergoes a plasma etching stage, in that at the exposed points 11,11',12,12' the insulating layer over the columns is removed and as a result, as shown in FIG. 14, pairs of blind holes 13/13',14/14' are formed on the columns. During the following, through electroplating stage the core is covered on both sides with a metal layer 15,15' which, as shown in FIG. 15, are electrically interconnected through the through-plated blind holes 13,13',14,14' and the selected columns.

The blind holes on the columns can obviously be produced by methods other than dry etching, e.g. by mechanical or laser drilling with a corresponding adaptation of the preceding stages.

Figure 15:
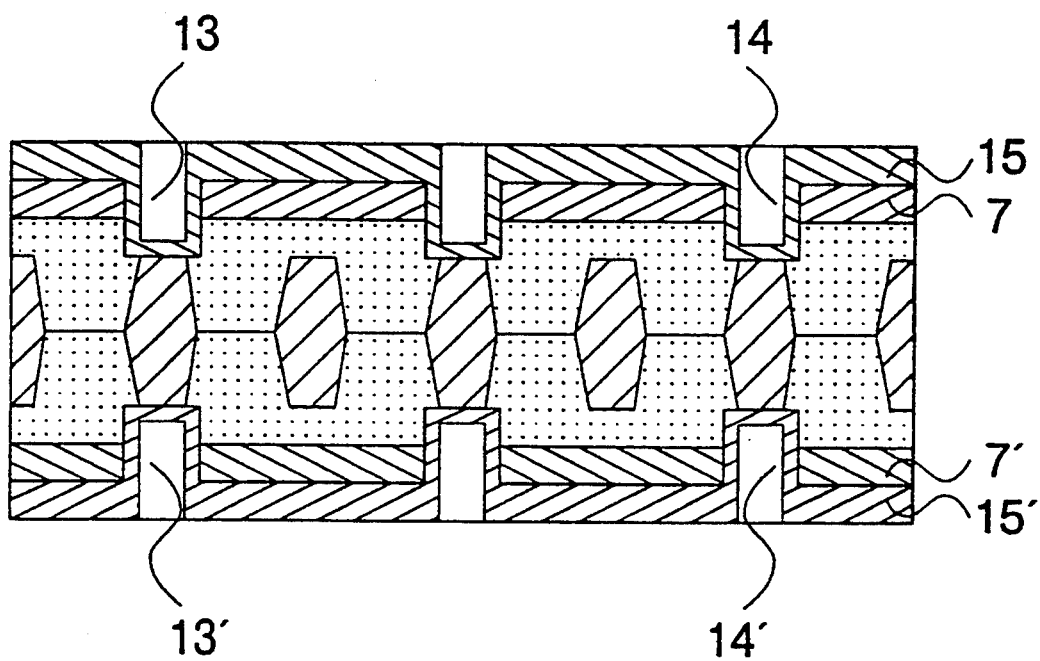
Figure 16:
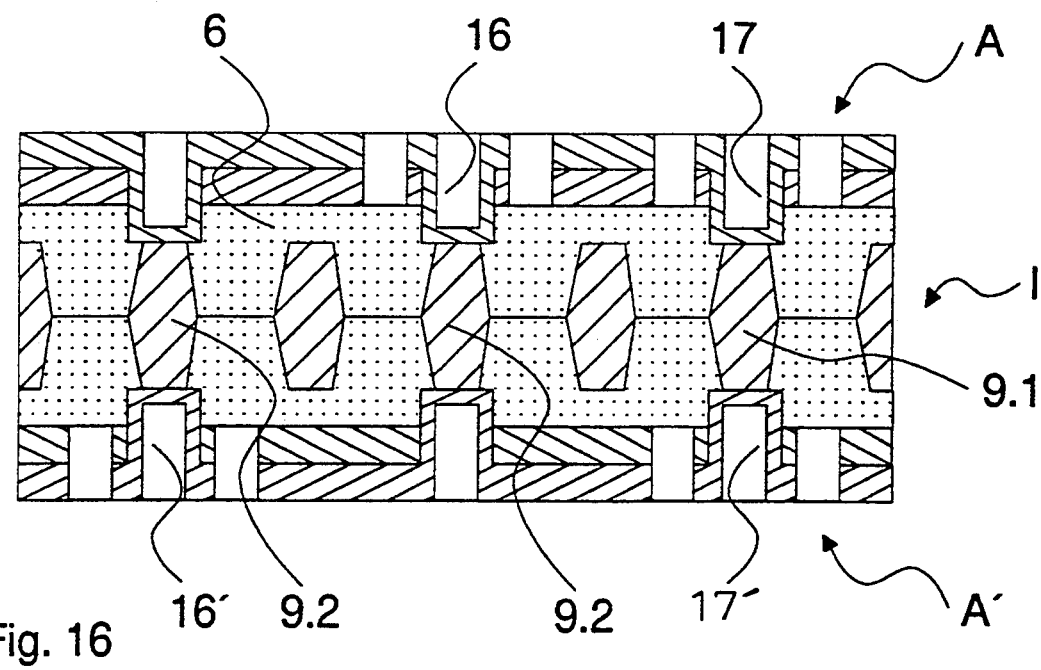

The core shown in FIG. 15 can now be further processed for individual use by corresponding photochemical structuring of the metal cover layers A,A' (15/7 and 15'/7') to conductor planes. This photochemical structuring can also be performed on a universal basis, as shown in FIG. 16. The two cover layers A,A' are e.g. structured to service planes, which are traversed by a regular pattern of terminals 16,16' on the facing service plane (via columns 9.2) and terminals 17,17' on Z-connections isolated from the service planes (through-connection columns 9.1).

FIG. 17 shows as a plan view one surface of the core according to FIG. 16. This shows a regular grid pattern, which can have a grid size d of preferably <2 mm, e.g. 0.5 mm. The grid points R.1, R.2 and R.3 are regularly utilized, the grid points R.1 are terminals on the facing service plane (16, FIG. 16), the grid points R.2 terminals for through-connections (17, FIG. 16) and grid points R.3 potential terminals on the visible service plane requiring no specific structuring.

FIG. 18 is a view of an area of a sectioned core according to FIG. 16, which has a Z-connection for a potential signal connection (column 9.1 with terminals 17,17') and a Z-connection for a terminal to the facing service plane (column 9.2, terminal 16).

FIG. 19 is a cross-section through an area of an exemplified circuit board with a core according to FIG. 16 comprising an inner layer I and metallic, structured cover layers A,A'. On either side of the core, the circuit board has in each case a foil layer, which comprises an electrically insulating coating 18' and a conductor plane L,L'. Through corresponding through-plated blind holes 19, as required, connection points of the connection grid are contacted on the core.

A foil circuit board according to FIG. 19 is e.g. produced in that onto a core according to FIG. 16 and using in each case an adhesive film, is laminated on either side a copper foil or a copper-coated plastic foil. By means of a first photochemical process the outer metal layer is etched away at those points where blind holes are provided on the core. Then, by plasma etching, the blind holes are produced and by following electroplating the blind holes are through-plated and the metal layers built up. In the resulting metal coatings, once again conductor patterns are etched with known photochemical processes.

We claim:

1. A core for a substrate for a circuit board comprising the combination of
    a substantially planar body of electrically insulating material having major surfaces on opposite sides;
    first and second electrically conductive cover layers on said major surfaces; and
    an array of electrically conductive elongated columns contained within said body, each column of said array having a central longitudinal axis substantially perpendicular to said major surfaces and having axially opposite ends spaced inwardly from said cover layers, whereby said columns are electrically isolated from said cover layers and from each other.

2. A core according to claim 1 wherein said columns have substantially equal lengths and are substantially uniformly spaced from each other in said array.

3. A core according to claim 2 wherein said cover layers and said columns are made from materials selected from the group including copper, laminated copper-aluminum-copper, steel, brass, bronze, an aluminum-magnesium alloy or molybdenum, and wherein said electrical insulating material is a curable plastic.

4. A printed circuit structure comprising the combination of
    a substantially planar body of electrical insulating material having major surfaces on opposite sides;
    first and second electrically conductive cover layers on said major surfaces, said cover layers having portions thereof selectively removed to define electrically conductive paths along said major surfaces;
    an array of electrically conductive elongated columns contained within said body, each column of said array having a central longitudinal axis substantially perpendicular to said major surfaces and having axially opposite ends spaced inwardly from planes containing said first and second cover layers, whereby said columns are electrically isolated from each other and are physically spaced from planes containing said first and second layers;
    means defining recesses extending through selected locations of said paths and into said body to selected ones of said columns; and
    electrically conductive material lining each of said recesses and contacting an end of said columns and said paths at said selected locations, thereby electrically connecting selected ones of said paths to selected ones of said columns.

5. A printed circuit structure according to claim 4 wherein said axes of said columns are substantially uniformly spaced from each other in said array by distances of less than 4 mm.

6. A printed circuit structure according to claim 4 and further comprising first and second layers of insulating material on opposite sides of said first and second electrically conductive layers from said body, said layers of insulating material having exposed outer surfaces;
    third and fourth electrically conductive layers on said exposed outer surfaces of said insulating material; and
    means defining recesses extending through said third and fourth electrically conductive layers and said first and second layers of insulating material at selected ones of said selected locations of said paths, thereby selectively interconnecting said third and fourth conductive layers to said first and second layers and to each other through said columns.

7. A printed circuit structure according to claim 6 wherein said first and second electrically conductive layers are connected respectively to a source of electrical power and to a ground; and
    said third and fourth electrically conductive layers have portions thereof removed to define electrically conductive paths.

* * * * *